United States Patent [19]

Freadman

[11] 4,429,181

[45] Jan. 31, 1984

[54] AUDIO SYSTEM

[75] Inventor: Tommyca Freadman, Bney-Brak, Israel

[73] Assignee: David Dohan, Israel; a part interest

[21] Appl. No.: 306,531

[22] Filed: Sep. 28, 1981

[51] Int. Cl.³ .............................................. H03H 11/34

[52] U.S. Cl. .................................... 381/99; 333/28 T; 381/98

[58] Field of Search ........... 179/1 D, 1 GA; 330/126; 333/28 T, 132

[56] References Cited

U.S. PATENT DOCUMENTS

| | | | |
|---|---|---|---|
| 3,497,621 | 2/1970 | Erath . | |
| 3,700,811 | 10/1972 | Davidson | 333/28 T X |
| 3,750,044 | 7/1973 | Stanley | 333/28 T X |
| 3,816,661 | 6/1974 | Huszty et al. | 179/1 D |
| 3,947,635 | 3/1976 | Frankman | 179/1 GA X |
| 3,949,325 | 4/1976 | Berkovitz | 179/1 D X |
| 4,046,960 | 9/1977 | Veale | 179/1 D |
| 4,100,371 | 7/1978 | Bayliff | 179/1 D X |
| 4,117,413 | 9/1978 | Moog | 330/126 |
| 4,166,197 | 8/1979 | Moog et al. | 179/1 D |
| 4,198,540 | 4/1980 | Cizek | 179/1 D |

FOREIGN PATENT DOCUMENTS

| | | | |
|---|---|---|---|
| 2815409 | 10/1978 | Fed. Rep. of Germany | 179/1 GA |

*Primary Examiner*—G. Z. Rubinson
*Assistant Examiner*—Keith E. George
*Attorney, Agent, or Firm*—Jacobs & Jacobs

[57] ABSTRACT

An audio system, characterized in that the audio signal passes through a preamplifier, equalization unit and electronic cross-over and before reaching the power amplifiers, which drive the speakers, is modified by an electronic resonance control correction (ERCC) circuit.

9 Claims, 6 Drawing Figures

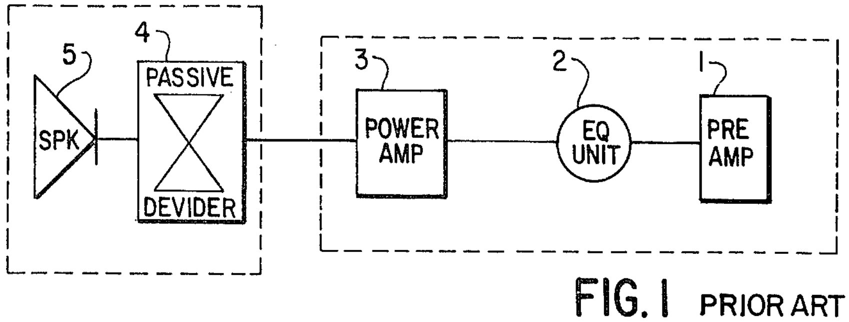
FIG. 1 PRIOR ART
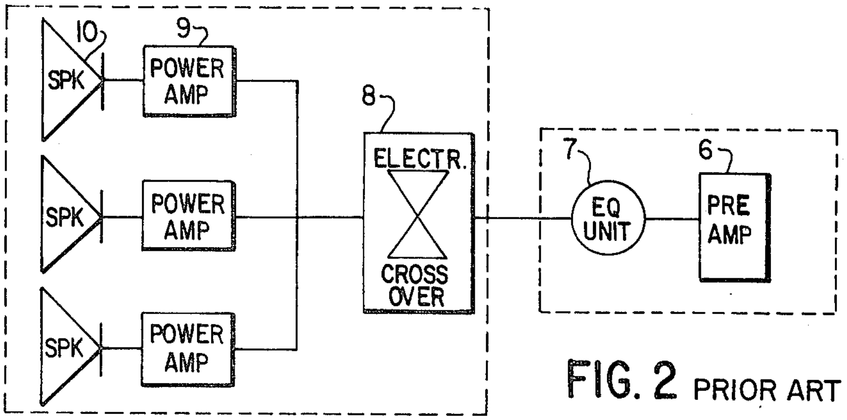
FIG. 2 PRIOR ART
FIG. 3
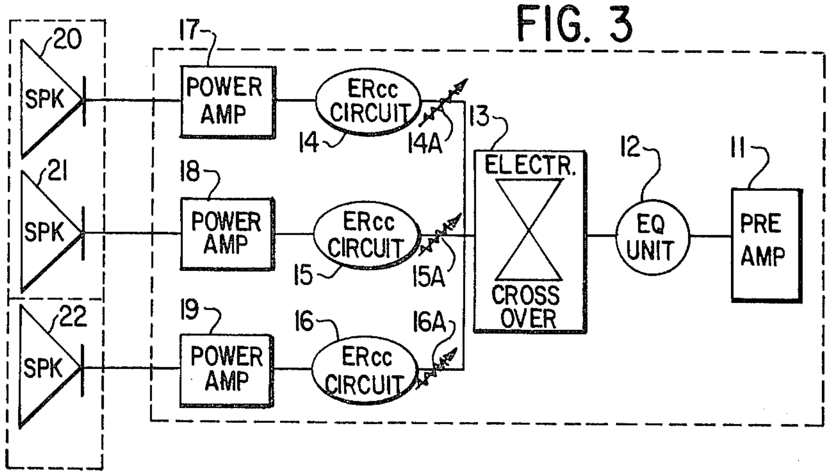

AUDIO SYSTEM

The present invention relates to an audio system for improving loudspeaker quality and efficiency.

The known audio amplification arrangements generally are only as efficient as the weakest link of the system, which generally is the speaker units.

In one group of prior systems, which is illustrated in FIG. 1, the preamplifier 1 comprises an equalization circuit which is adapted to the standards of RIAA, a high-low pass filter and an equalizer circuit 2 to control the high or low frequencies (boost or cut), followed by a power amplifier 3 which is connected to the speaker divided by a passive divider 4 which divides the signal between each of the ranges of the sound bands of the speakers 5. (For simplicity, only one speaker is shown). The efficiency of this arrangement is low due to losses in the passive cross-over elements and the phase angles between the three speakers (woofer, tweeter, midrange) are inaccurate.

A second known audio system is illustrated in FIG. 2 which comprises likewise a preamplifier 6, an equalization circuit 7, together known as a preamplifier unit, an electronic cross-over 8 which leads to separate power amplifiers 9 each driving a speaker 10, all mounted in one speaker cabinet (not shown) and forming a speaker unit having a woofer, tweeter, and midrange speakers 10. This is an inconvenient arrangement, since each speaker 10 has to be connected to an AC voltage line. Except for the improved efficiency achieved by this arrangement, there is no acoustical improvement over the combination shown in FIG. 1.

It is known that in audio research in the laboratory, different sound qualities are obtained when the same speakers in the same environment are fed by different amplifiers, even though these have the same electronic characteristics.

In compound systems (two-way or three-way systems), the frequency response curve of each speaker varies due to different signal levels which create a disproportion between the frequency response curves of the speakers when the system is used at varying signal levels.

Some manufacturers claim to have found means for adjusting the proper phase angle between speakers which they call time-aligned speakers. All these systems are very expensive to manufacture and use expensive high-quality speaker elements, thus increasing the cost of the entire stereo set considerably.

It is the object of the present invention to provide an audio system using conventional inexpensive speaker elements and completely changing the sound quality and acoustical efficiency.

It is a further object of the invention to provide an amplification method in which the lack of linearity of the frequency response curves (f.r.c.) of the speaker units is corrected.

It is still a further object of the invention to permit the user easily to adjust the acoustic proportions among the speaker elements according to his own requirements.

It is still a further object of the present invention to provide an audio system that is simple in construction and inexpensive to manufacture.

The present invention provides an audio system wherein the audio signal passes through a preamplifier, equalization unit and electronic cross-over and before reaching the power amplifiers, which drive the speakers, is modified by an electronic resonance control correction circuit. This electronic resonance control correction circuit will hereinafter be designated as the ERCC circuit. It is preferred that all the aforesaid units are built into one housing which can be controlled by the user.

The invention is illustrated, by way of example only, in the accompanying drawings wherein:

FIGS. 1 and 2 are prior art systems;

FIG. 3 is a block diagram of the circuit of the arrangement method according to the invention;

Figure 4:
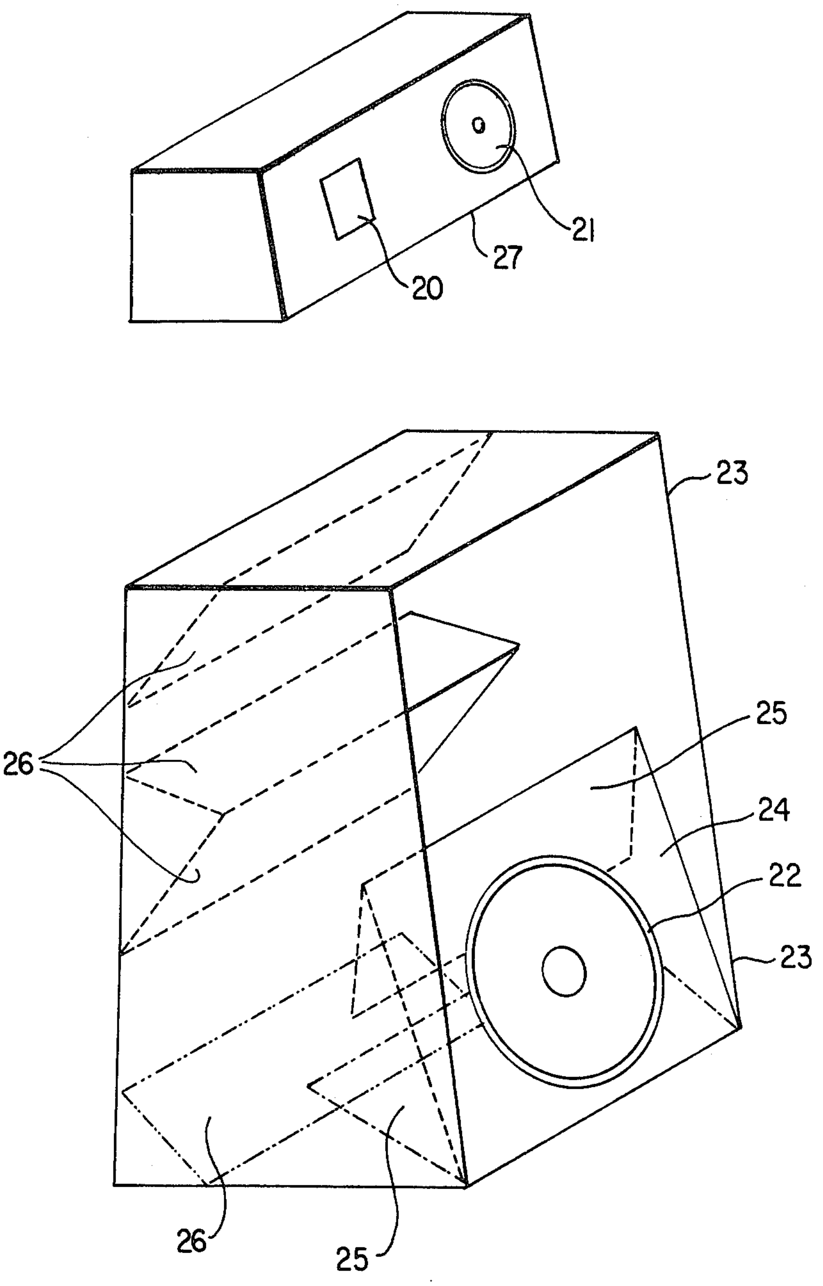
FIG. 4 is a perspective view of the housing arrangement for the speakers.

Referring to FIG. 3, an audio signal passes through a preamplifier 11 which feeds into an equalizer 12 and from there to an electronic cross-over 13. Three ERCC circuits 14, 15 and 16 are associated with power amplifiers 17, 18 and 19 respectively, the amplifiers driving the speakers 20, 21 and 22, respectively. Variable resistors 14*a*, 15*a* and 16*a* are provided for manual training.

Figure 5:
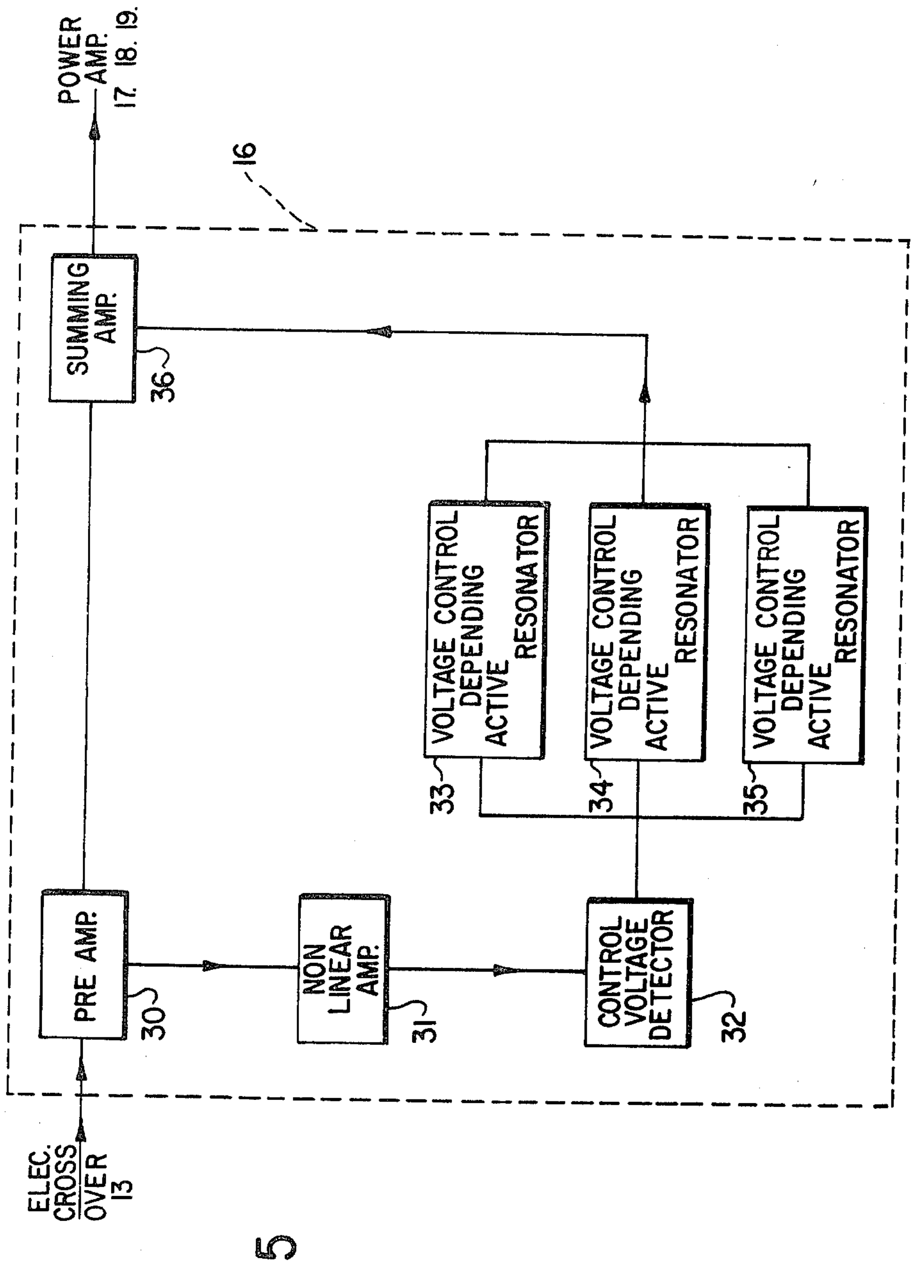
FIG. 5 is a block diagram illustrating the components of the ERCC circuit 14, 15, 16 used in the circuit of FIG. 3.

The ERCC circuits 14, 15 and 16 have the same components, and FIG. 5 illustrated ERCC 16 by way of example. Thus ERCC 16 has a preamplifier 30, a non-linear amplifier 31, a voltage control detector 32, three active resonators 33, 34 and 35 which are dependent on voltage applied to them and are arranged in parallel and a summing amplifier 36. Thus when hereinafter an ERCC circuit is mentioned, it takes the form of the circuit designed above and shown in FIG. 5.

ERCC circuit 16 receives the low range (bass) signal from electronic cross-over 13, and modifies this signal by a three band selectable group of control circuits 33, 34 and 35. Circuit 33 modifies the low range signal near the resonant point; circuit 34 modifies it near the central portion; and circuit 35 modifies it at the upper cross-over point.

ERCC circuit 15 receives the mid-range portion of the audio signal and likewise modifies it into three sections: at the lower cross-over point (circuit 33), middle portion (circuit 34) and upper cross-over point (circuit 35).

ERCC circuit 14 receives the high range (treble) signal from the electronic cross-over 13 and also modifies this signal by circuits 33, 34 and 35: at the lower cross-over point (circuit 33); at the middle portion (circuit 34) and at the uppermost frequency (circuit 35). This will control any speaker to produce an undistorted and full coloration high frequency reproduction.

It is, of course, clear from the above description that this arrangement permits control of each of the sound ranges completely independently from each of the others. This control is effected in that the preamplifier 11, equalizer 12, electronic cross-over 13 ERCC circuits 14, 15 and 16 and power amplifiers 17, 18 and 19 are mounted in a housing (not shown) having an instrument panel with manual controls as known with conventional amplifier systems, one manual control here being associated with each ERCC circuit.

As shown in FIG. 4, the bass speaker 22, is housed in housing 23 by being mounted on a plate 24 integral with brackets 25 so that it assumes an angle with the front of the housing 23. The back wall of housing 23 is provided with a number of angularly disposed plates 26 so positioned that they constitute acoustic reflectors for the sound from speaker 22. Mid-range speaker 21 and high range speaker 20 are housed in a housing 27, which may be designed, if desired, so as to be placed on top of housing 23.

The signal from electronic cross-over 13 passes through variable resistor 16*a* and is applied to the non-invert, (positive) input of preamplifier 30, which acts as a unity gain impedance matching device. The output of amplifier 30 is split into amplifier 36 through resistor 41 and into non-linear amplifier system 31 through resistor 44, which is provided to prevent overloading. The gain of non-linear amplifier system 31 depends on the ratio R8/R9, where R8 is in parallel with field effect transistor (F.E.T.) 52, which works as a voltage control resistor. The output signal of amplifier system 31A is rectified by diode 53, which creates the gate voltage to the F.E.T. 52. As the output level of amplifier 31A rises above a preset amount, F.E.T. 52 reduces the resistance which is parallel to R8 and the gain of the amplifier system 31 will drop. With this combination a non-linear amplification curve is obtained which is designed in such a way that a low signal is amplified more than a high signal. This arrangement is desired in order to get a high sensitivity amplifier for the resonator circuits 33, 34 and 35.

The signal from amplifier system 31A passes through diode 51 which rectifies the audio signal and through resistor $R_7$ and capacitor $C_3$, to obtain a half-wave DC voltage. $R_3$ is a discharging resistor for the DC voltage stored in $C_3$. This arrangement will control the release time of the potential which is the control voltage through resistor combination $R_4$, $R_5$ and $R_6$ which establishes the gate voltage for F.E.T. 45, 46 and 47.

Referring back to amplifier 30, the signal from resistor 41 is fed into an amplifier 36 which acts as an equalizer and summing amplifier. Variable resistors 48, 49 and 50 operate to manually increase or decrease the resonance frequency of resonators 54, 55 and 56 which are associated with F.E.T. 45, 46 and 47, respectively. F.E.T. 45, 46, and 47 act as voltage control dependant resistors that control the amplitude of the resonance signal fed to the center tap of variable resistors (potentiometers) 48, 49 and 50. That is, the effective resistance of F.E.T. 45, 46 and 47 is controlled and determined by the voltage applied to each F.E.T. in a manner described in detail below, such that the stronger the audio signal at a point in time will provide each F.E.T. 45, 46 and 47 with a larger resistance and hence less boost.

The resonance frequency of the voltage control dependent active resonators 33, 34 and 35 is selected through a combination of the two capacitors and two resistors in the amplifier circuits 54, 55 and 56. $C_1$,$R_1$ and $C_2R_2$ are additional decay time components, where when $C_2$ is charged, it will remain charged longer than $C_1$, which has a lower capacitance value. The resistors $R_1$ through $R_6$ control the voltages applied to F.E.T. 45, 46 and 47 and the RC circuits formed by capacitors $C_1$, $C_2$ and $C_3$ and their associated resistors control the decay time of the signals generated by circuits 33, 34 and 35. The values of the RC circuits $C_1R_1C_2R_2C_3R_3$ and $R_4$, $R_5$, $R_6$ are chosen such that the signal from circuit 35 decays fastest, the signal from circuit 34 decays next and lastly the signal from circuit 33 decays. This then gives the effect of modifying the audio signal at the three portions described above.

Figure 6:
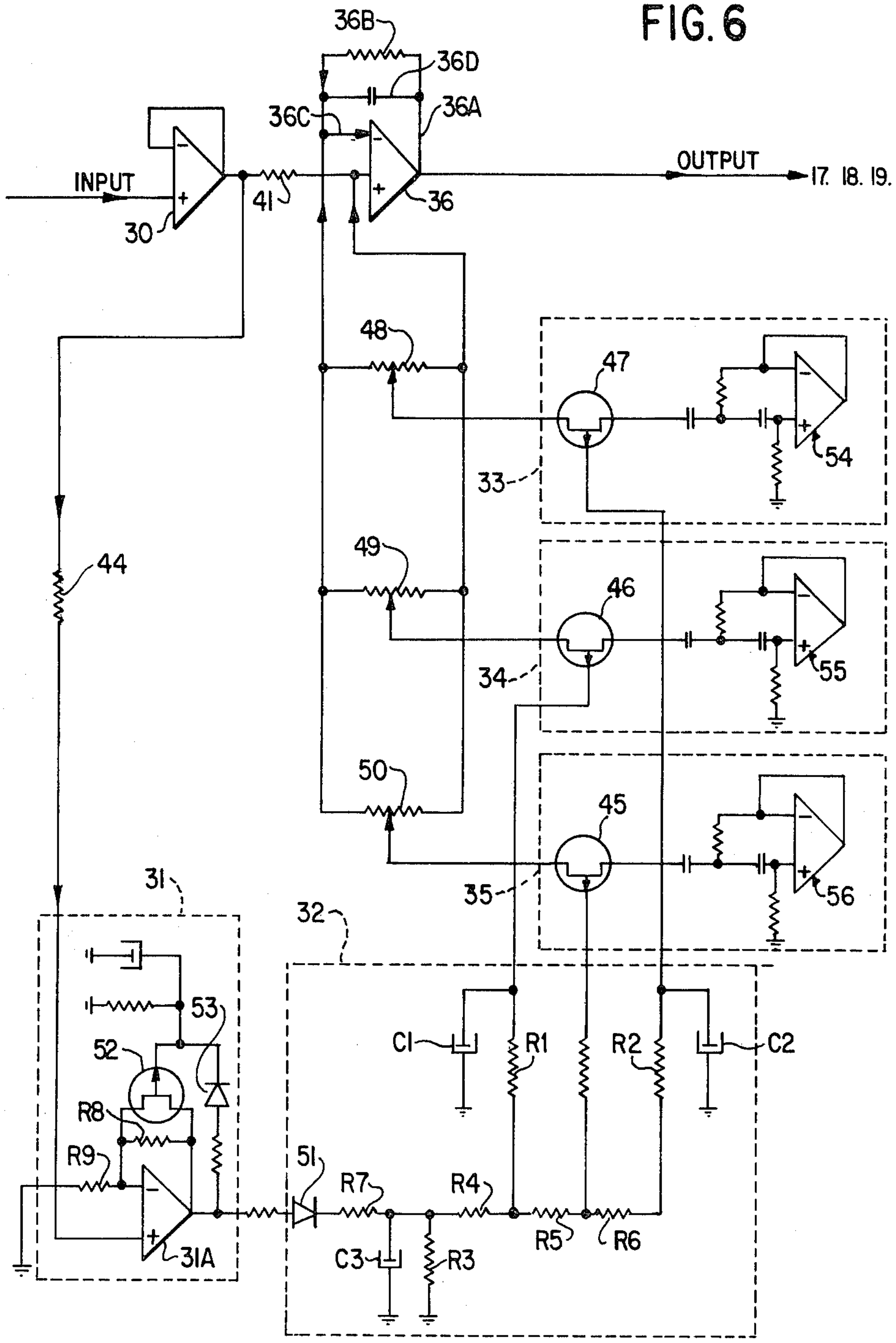
FIG. 6 is a schematic of the ERCC.

When the center tap of resistor 48, which applies the resonance frequency of resonator circuit 33 is moved to the left as viewed in FIG. 6, the frequency is reduced from the feedback circuit 36*a*, 36*b*, and 36*c* of amplifier 36 and will result in a boost at the output of amplifier 36 at the resonance frequency. The amount of boost is also dependant on the gate voltage of F.E.T. 47, namely there will be less boost at stronger input signal and more boost at weaker input signal. The result is a dynamic control modified output signal. It is noted that 36*d* is merely to prevent oscillations.

The same modification is effected by circuits 34 and 35. The frequency of the output signal from each of circuits 33, 34 and 35 matches the desired portion of the input signal to give the modification described above.

The ERCC circuits 14 and 15 are constructed as in ERCC circuit 16 (FIG. 6) and are adapted to modify the high range and mid-range portions of the audio signal in three sections in a manner described in terms of ERCC 16.

This results in a multi-modified dynamic controlled output signal.

It can be seen from the above that with the use of the ERCC circuit according to the invention, the following advantages are obtained:

(1) The frequency response curve (f.r.c.) of each speaker at any level, is corrected.

(2) The f.r.c. is corrected in each speaker separately according to changes at the signal level maintaining linear characteristics in spite of the dynamic changes.

(3) Constant balance and/or constant proportion is created among the f.r.c.'s of the speakers in any multi-way system at any signal level.

I claim:

1. An audio system having a preamplifier, equalization unit, electronic cross-over, a set of speakers and a set of power amplifiers for driving the set of speakers, and wherein said preamplifier, said equalization unit and set cross-over are connected for passage of an audio signal to said set of power amplifiers, said system further comprising a set of electronic resonance control correction (ERCC) circuits connecting between said cross-over and respective ones of said power amplifiers for modifying said audio signal prior to amplification by said power amplifiers, and wherein said electronic cross-over delivers an input audio signal of a desired frequency range to each of said ERCC circuits; and wherein each of said ERCC circuits comprises a plurality of resonators responsive to signals at frequencies at different portions of the input audio signal spectrum:

a nonlinear amplifier for amplifying said input audio signal to generate a control signal; and decay means operatively connected between said nonlinear amplifier and said plurality of resonators for coupling said control signal to each of said resonators, said decay means decaying said control signal at differing rates for each of said resonators.

2. An audio system, according to claim 1, characterized in that each ERCC circuit is adapted to be manually controlled independent of the other by the user.

3. An audio system according to claim 1 or claim 2, characterized in that one of said resonators generates a modifying signal at the portion of the frequency range desired to be modified, and wherein each of said ERCC circuits comprises control means for applying said modifying signal to said input audio signal, said control means being operable to dynamically vary the amplitude of said modifying signal inversely with the amplitude of said input audio signal.

4. An audio system having a preamplifier, equalization unit, electronic cross-over, a set of speakers and a set of power amplifiers for driving the set of speakers, and wherein said preamplifier, said equalization unit and said cross-over are connected for passage of an audio signal to said set of power amplifiers, said system further comprising a set of electronic resonance control correction (ERCC) circuits connecting between said cross-over and respective ones of said power amplifiers for modifying said audio signal prior to amplification by said power amplifiers; and wherein said electronic cross-over delivers an input audio signal of a desired frequency range to each ERCC circuit, each ERCC circuit including a resonator means for generating a modifying signal at the portion of the frequency range desired to be modified, and control means for applying said modifying signal to said input audio signal, said control means being operable to dynamically vary the amplitude of said modifying signal inversely with the amplitude of said input audio signal; said system being further characterized in that each ERCC circuit comprises three voltage control dependent resonator circuits for generating three modifying signals at frequencies at different portions of the input audio signal, each resonator circuit including a field effect transistor whose resistance varies inversely with the gate voltage, a nonlinear amplifier for amplifying said input audio signal and generating an output voltage, a resistor network for dividing said output voltage into three control voltage signals of predetermined value, each control voltage signal being applied to the gate of one of said field effect transistors to establish the gate voltage of said transistors, said gate voltage being proportional to the amplitude of said input audio signal, a summing amplifier, said input audio signal and said modifying signals being applied to the non-inverting input of said amplifier, and the output of said summing amplifier providing a dynamically modified ouput signal.

5. An audio system according to claim 4, characterized in that said non-linear amplifier amplifies a low signal more than a high signal.

6. An audio system according to claim 4, characterized in that RC circuit means is operatively associated with said field effect transistors to decay each said modifying signals at a different rate.

7. An audio system according to claim 4 or claim 5, characterized in that one of said speakers is a base range speaker wherein the base range speaker is housed in one housing, other ones of said speakers being mid-range and high-range speakers wherein the mid-range and high-range speakers are housed in another housing, and wherein the preamplifier, equalizer, electronic cross-over, ERCC circuits, and power amplifiers are housed in a housing having an instrument panel to be manually controlled.

8. An audio system according to claim 7, characterized in that the back wall of the housing for the base range speaker is provided with angularly disposed plates, constituting acoustic reflecting surfaces.

9. An audio system according to claim 5, characterized in that RC circuit means is operatively associated with said field effect transistors to decay each said modifying signal at a different rate.

* * * * *